United States Patent
Song et al.

(10) Patent No.: US 8,796,777 B2
(45) Date of Patent: Aug. 5, 2014

(54) FIN-TYPE DEVICE SYSTEM AND METHOD

(75) Inventors: Seung-Chul Song, Austin, TX (US);
Mohamed Abu-Rahma, San Diego, CA (US); Beom-Mo Han, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 833 days.

(21) Appl. No.: 12/552,359

(22) Filed: Sep. 2, 2009

(65) Prior Publication Data
US 2011/0051535 A1    Mar. 3, 2011

(51) Int. Cl.
*H01L 29/786*    (2006.01)
*H01L 29/78*    (2006.01)

(52) U.S. Cl.
CPC ...... *H01L 29/7831* (2013.01); *H01L 29/78648* (2013.01)
USPC .................. 257/365; 257/401; 257/E29.264; 257/E29.275

(58) Field of Classification Search
CPC .. G11C 7/1078; G11C 7/109; H01L 29/7831; H01L 29/786; H01L 29/78645; H01L 29/78648; H01L 29/75696
USPC ............ 365/189.16, 187, 188, 222; 257/365, 257/401, E29.264, E29.275
See application file for complete search history.

(56) References Cited

U.S. PATENT DOCUMENTS

| | | | |
|---|---|---|---|
| 5,899,710 A | 5/1999 | Mukai | |
| 6,433,609 B1 | 8/2002 | Voldman | |
| 6,800,885 B1 | 10/2004 | An et al. | |
| 2004/0075122 A1 | 4/2004 | Lin et al. | |
| 2005/0003592 A1 | 1/2005 | Jones | |
| 2005/0141262 A1 | 6/2005 | Yamada et al. | |
| 2007/0007574 A1 | 1/2007 | Ohsawa | |
| 2007/0008013 A1 | 1/2007 | Fijany et al. | |
| 2008/0105898 A1 | 5/2008 | Joshi et al. | |
| 2009/0078982 A1 | 3/2009 | Rachmady et al. | |
| 2009/0101975 A1* | 4/2009 | Holz et al. | 257/347 |
| 2009/0212341 A1 | 8/2009 | Cheng et al. | |

FOREIGN PATENT DOCUMENTS

| | | |
|---|---|---|
| JP | 2000269155 A | 9/2000 |
| JP | 2006504267 A | 2/2006 |
| JP | 2007018588 A | 1/2007 |
| WO | WO2011028796 A1 | 3/2011 |

OTHER PUBLICATIONS

International Search Report and Written Opinion—PCT/US2010/047523, International Search Authority—European Patent Office—Feb. 9, 2011.

(Continued)

*Primary Examiner* — Allison P Bernstein
(74) *Attorney, Agent, or Firm* — Sam Talpalatsky; Nicholas J. Pauley; Joseph Agusta

(57) ABSTRACT

A method includes forming a gate of a transistor within a substrate having a surface and forming a buried oxide (BOX) layer within the substrate and adjacent to the gate at a first BOX layer face. The method also includes forming a raised source-drain channel ("fin"), where at least a portion of the fin extends from the surface of the substrate, and where the fin has a first fin face adjacent a second BOX layer face of the BOX layer.

8 Claims, 11 Drawing Sheets

(56) References Cited

OTHER PUBLICATIONS

Okuyama K, et al., "Control of Subthreshold Characteristics of Narrow-Channel Silicon-on-Insulator N-type Metal-Oxide-Semiconductor Transitor With Additional Side Gate Electrodes", Japanese Journal of Appled Physics, Japan Society of Applied Physics, JP, vol. 46, No. 4B, Part 01, Apr. 1, 2007, pp. 2050-2053, XP001505833, ISSN: 0021-4922, DOI: DOI:10.1143/JJAP.46.2050.

Taiwan Search Report—TW099129739—TIPO—Apr. 18, 2013.

* cited by examiner

FIN-TYPE DEVICE SYSTEM AND METHOD

I. FIELD

The present disclosure is generally related to fin-type devices.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A fin-type Field Effect Transistor (FinFET or FinFET transistor herein) is a field effect transistor that includes a fin-shaped source-drain channel protruding from a substrate. The FinFET transistor can be an effective space-saving active element that can be employed in portable computing devices. One use of a FinFET device is as part of a memory in a portable computing device.

III. SUMMARY

In a particular embodiment, a method of fabricating a transistor is disclosed. The method includes forming a gate of a transistor within a substrate having a surface, and forming a buried oxide (BOX) layer within the substrate. The BOX layer is adjacent to the gate at a first BOX layer face. The method also includes forming a raised source-drain channel ("fin") having at least a portion of the fin that extends from the surface of the substrate, where the fin has a first fin face adjacent a second BOX layer face.

In another particular embodiment, a transistor is disclosed that includes a source-drain channel ("fin") protruding from a surface of a substrate. The transistor includes a first gate electrically coupled to the fin at a first fin face and separated from the fin by a buried oxide (BOX) layer situated within the substrate.

In another particular embodiment, a method of programming a bit cell is disclosed and includes biasing a first gate of a bit cell at a first write bias voltage, where the first gate is electrically coupled to a source-drain channel ("fin") of the bit cell. The fin has a source end and a drain end and protrudes from a substrate. The first gate is separated from the fin by a buried oxide (BOX) layer situated within the substrate. The method also includes applying a program voltage between the source end of the fin and the drain end of the fin.

One particular advantage provided by at least one of the disclosed embodiments is that when the FinFET transistor described is utilized as a bit cell in a memory, controlling a bias at a gate separated from the fin by the BOX layer enables an increased time period between memory refreshes, and a consequent reduction in power consumption.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
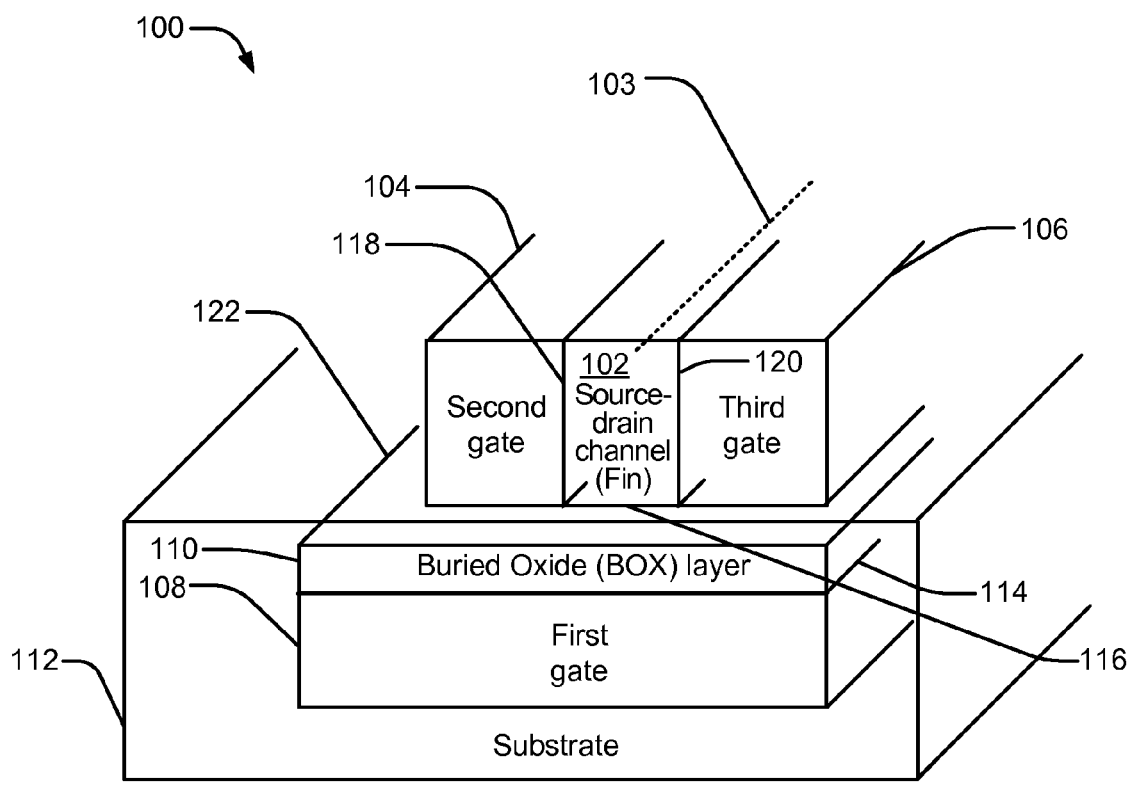
FIG. 1 is a diagram of a first illustrative embodiment of a FinFET transistor that may be employed in a bit cell of a memory device.

FIG. 1 is a diagram of a first illustrative embodiment of a FinFET transistor, generally designated as 100. The FinFET transistor 100 includes a source-drain channel 102 ("fin") protruding from a surface of a substrate 112. The fin 102 is situated on a Buried Oxide (BOX) layer 110 that is situated within the substrate 1 12. In a particular illustrative example, the substrate 112 is a silicon substrate. The BOX layer 110 forms a portion of a silicon substrate that includes a first gate 108 (also called "bottom gate") situated beneath the BOX layer 110. The BOX layer 110 is adjacent to the first gate 108 at a first BOX layer face 114. The fin 102 has a first fin face 116 adjacent a second BOX layer face 122 of the BOX layer 110. In a particular illustrative embodiment, the first gate 108 is electrically coupled to the fin 102 through the BOX layer 110. In a particular illustrative embodiment, the first gate 108 is operable to be electrically coupled to a first bias source (not shown). A second gate 104 (also called "front gate") is situated adjacent to a second fin face 118 of the fin 102. In a particular illustrative embodiment, the second gate 104 is electrically coupled to the fin 102 at the second fin face 118. In a particular illustrative embodiment, the second gate 104 is operable to be electrically coupled to a second bias source (not shown). A third gate 106 (also called "back gate") is situated adjacent to a third fin face 120 of the fin 102. In a particular illustrative embodiment, the third gate 106 is electrically coupled to the fin 102 at the third fin face 120. In a particular illustrative embodiment, the third gate 106 is operable to be electrically coupled to a third bias source (not shown). The FinFET transistor 100 according to the geometry illustrated may include silicon-on-insulator (SOI) technology.

In operation, the fin 102 may be electrically biased along a longitudinal axis 103 of the fin 102, which can cause a current to flow along a direction parallel to the longitudinal axis 103. Current flow may be gated by the first gate 108, which is coupled to the fin 102 through the BOX layer 110. Current flow through the fin 102 may also be gated by the second gate 104, and by the third gate 106. The first gate 108, the second gate 104, and the third gate 106 are each independently electrically biasable, i.e., each of the first gate 108, the second gate 104, and the third gate 106, may be independently biased. In a particular illustrative embodiment, the transistor 100 is configured to be programmed by applying a first electrical bias to the first gate 108, a second electrical bias to the second gate 104, and a third electrical bias to the third gate 106, and by electrically biasing the fin 102 along the longitudinal axis 103 of the fin 102. In a particular illustrative embodiment, when the fin 102 is biased, a plurality of electrical holes (also called "holes" herein) accumulates within the fin 102. A combination of gate biases can affect the current flow through the fin 102. By allowing each of the gates 108, 104, and 106 to be independently biasable, current flow through the fin 102 may be controlled in a manner that maintains a relatively low bias voltage for any of the three gates. A low gate bias of each gate voltage, when maintained during a HOLD phase of bit storage can result in a longer refresh cycle time, and consequently reduced power consumption.

Figure 2:
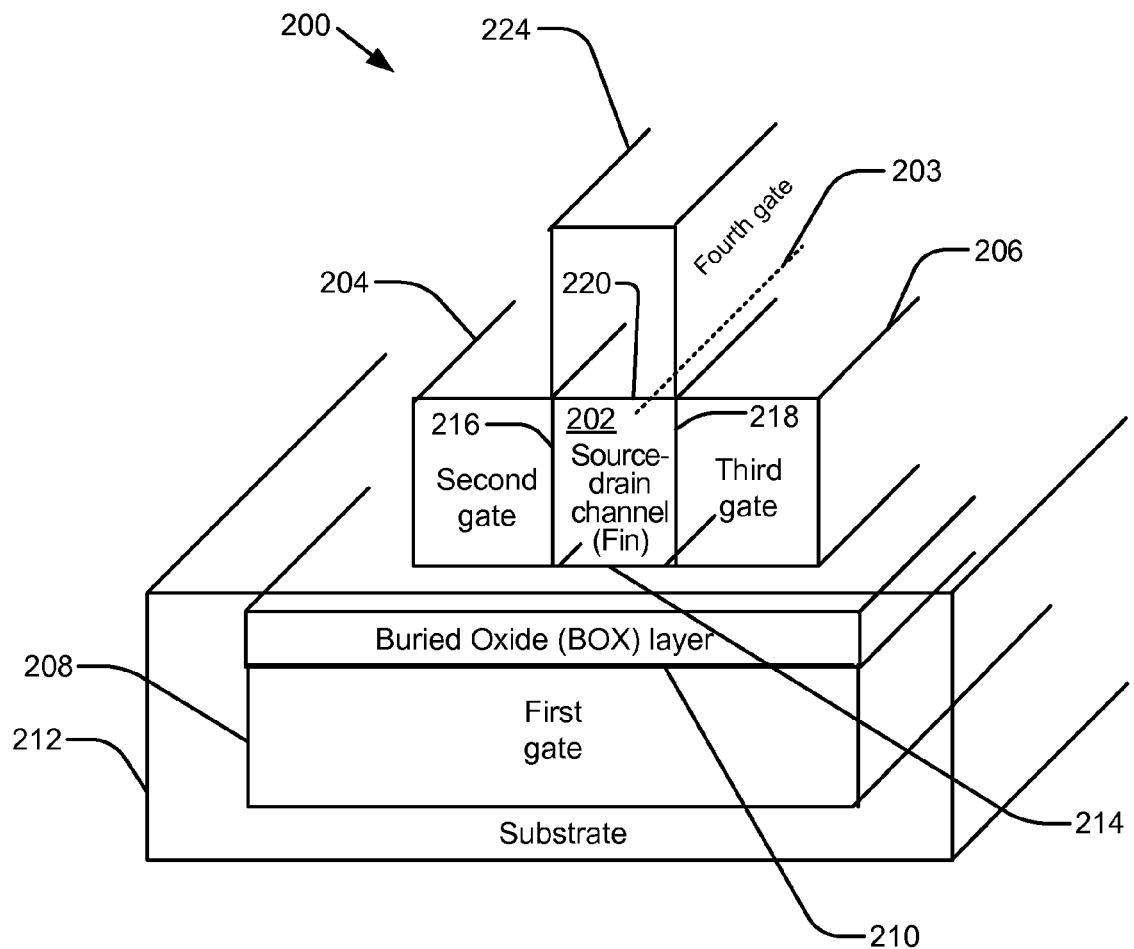
FIG. 2 is a second illustrative embodiment of a FinFET transistor that may be employed in a bit cell of a memory device.

FIG. 2 is a diagram of a second illustrative embodiment of a FinFET transistor, generally labeled 200. The FinFET transistor 200 includes a source-drain channel (fin) 202, which is situated on a Buried Oxide (BOX) layer 210 that is situated within a substrate 212. In a particular illustrative example, the substrate 212 is a silicon substrate. Situated beneath the BOX layer 210 is a first gate 208. In a particular illustrative embodiment, the first gate 208 lies adjacent to the BOX layer 210. In a particular illustrative embodiment, the first gate 208 is electrically coupled to the fin 202 at a first fin face 214. A second gate 204 is situated adjacent the fin 202 at a second fin face 216 of the fin 202 and may be separated from the fin 202 by a gate oxide (not shown). In a particular illustrative embodiment, the second gate 204 is electrically coupled to the fin 202 at the second fin face 216. A third gate 206 is situated adjacent the fin 202 at a third fin face 218 of the fin 202, and may be separated from the fin 202 by another oxide layer (not shown). In a particular illustrative embodiment, the third gate 206 is electrically coupled to the fin 202 at the third fin face 218. A fourth gate 224 is situated adjacent a fourth fin face 220 of the fin 202 and may be separated from the fin 202 by yet another oxide layer (not shown). In a particular illustrative embodiment, the fourth gate 224 is electrically coupled to the fourth fin face 220 of the fin 202.

The fin 202 may be biased along a longitudinal axis 203 of the fin 202, causing current to flow in a direction parallel to the longitudinal axis 203. Each of the gates 208, 204, 206, and 224 may be independently electrically biased. Each of the gates 208, 204, 206, and 224, when biased, may affect a magnitude of current flow through the fin 202. In particular, the first gate 208 is electrically coupled to the fin 202 through the BOX layer 210. By independently biasing each of the gates 208, 204, 206, and 224, current flow along a longitudinal axis of the fin 202 may be controlled utilizing relatively low bias voltages as compared with another system that lacks an independently biasable lower gate. In a particular embodiment where the FinFET transistor 200 is used as a storage device (as will be described later), a small value of bias voltage maintained at each gate during a HOLD phase of bit storage can result in a longer refresh cycle time, and consequently reduced power consumption.

Figure 3:
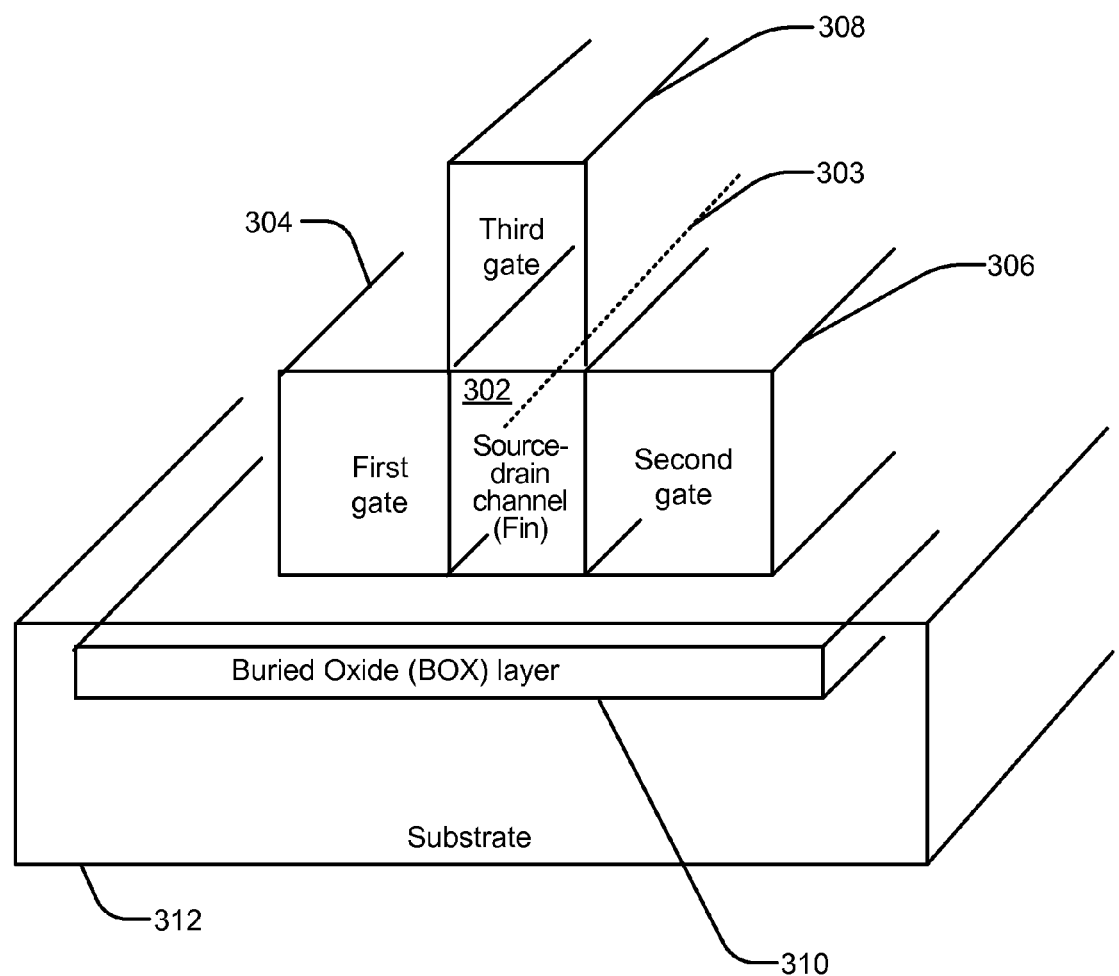
FIG. 3 is a third illustrative embodiment of a FinFET transistor that may be employed in a bit cell of a memory device.

FIG. 3 is a diagram of third illustrative embodiment of a FinFET transistor that may be employed in a bit cell of a memory device, generally designated 300. The FinFET transistor 300 may be utilized as a single bit storage device in a multi-bit memory (such as a memory device to be described in FIG. 8). The FinFET transistor 300 includes a source-drain channel (fin) 302, situated on a Buried Oxide (BOX) layer 310 that is situated within a substrate 312. In a particular illustrative example, the substrate is 312 a silicon substrate. A first gate 304 is situated adjacent to a first face of the fin 302, and may be separated from the fin 302 by a thin oxide layer (not shown). A second gate 306 is situated adjacent a second face of the fin 302, and may be separated from the fin 302 by another thin oxide layer (not shown). A third gate 308 is situated adjacent a third face of the fin 302, and may be separated from the fin 302 by yet another thin oxide layer (not shown).

In operation, each of the gates 304, 306, and 308 of the FinFET transistor 300 may be independently biased. Additionally, the fin 302 may be biased along a source-drain longitudinal axis 303 of the fin 302, which can cause current to flow along a direction parallel to the source-drain longitudinal axis 303. Biasing one or more of the gates 304, 306, and 308, can control current flow along the fin 302. When the FinFET transistor 300 is utilized as a bit storage device in a memory, both WRITE and HOLD operations may be accomplished at relatively low gate bias voltages as compared with a system having only one or two independently biasable gates.

Figure 4:
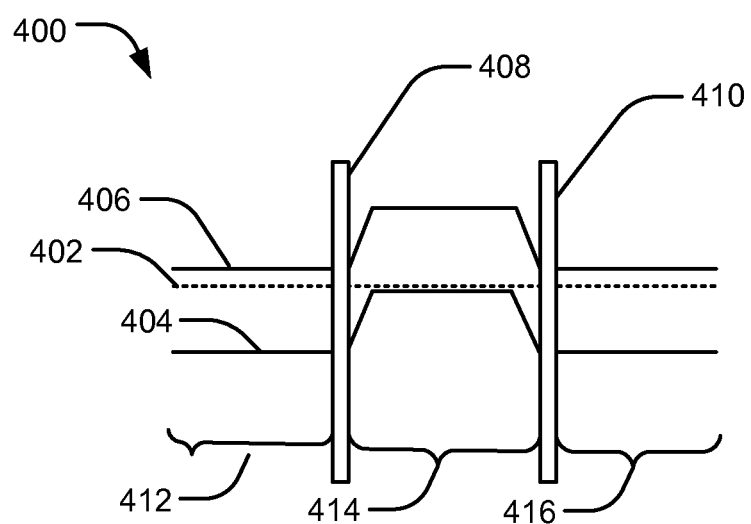
FIG. 4 is an energy band diagram of a FinFET transistor in an unbiased condition, according to a particular embodiment.

FIG. 4 is an energy band diagram of a FinFET transistor that may be used as a memory device. The energy band diagram, generally designated 400, is associated with a condition of thermal equilibrium of the FinFET transistor prior to biasing, according to a particular embodiment. The energy band diagram 400 includes a first region 412 associated with a front gate of a FinFET transistor, a second region 414 associated with a fin of the FinFET transistor, and a third region 416 associated with a back gate of the FinFET transistor. In a particular embodiment, the front gate is the gate 104, 204, or 304, and the back gate is the corresponding gate 106, 206, or 306 of FIGS. 1, 2, or 3, respectively. A dashed line 402 represents a Fermi level, which is a constant energy level across the three adjacent regions 412, 414, and 416. A line 404 passing through each of the three regions 412, 414, and 416 represents a valance band energy level within the FinFET. A line 406 appearing in each of the regions represents a conduction band energy level within the FinFET. A vertical bar 408 represents a boundary separating the first gate (front gate) and the fin. A vertical bar 410 represents a boundary separating the fin and the second gate (back gate). In a particular embodiment, the vertical bars 408 and 410 are oxide layers separating the corresponding gate from the fin. The energy band diagram 400 is associated with the FinFET transistor in thermal equilibrium prior to biasing the gates with externally applied voltages.

Figure 5:
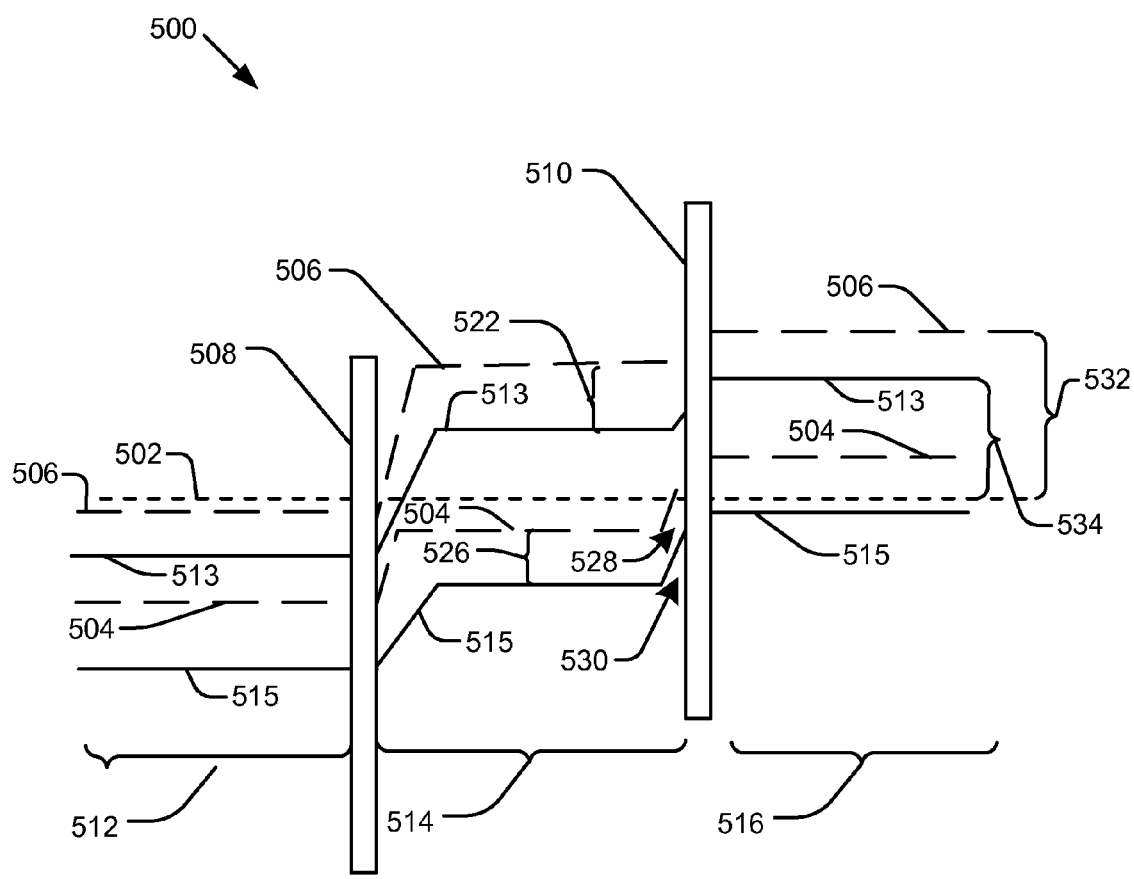
FIG. 5 is an energy band diagram of a FinFET transistor that illustrates the first gate during a WRITE phase, according to a particular embodiment.

FIG. 5 is an energy band diagram of a FinFET transistor during a WRITE phase, according to a particular embodiment. The FinFET transistor includes a first gate situated beneath a BOX layer, a second gate (front gate), and a third gate (back gate). In an illustrative embodiment, the FinFET transistor may be the FinFET transistor 100 of FIG. 1. A region 512 includes energy band levels in the front gate. A region 514 includes energy band levels within an interior of a fin of the FinFET transistor. A region 516 represents energy band levels in the back gate of the FinFET transistor. A Fermi Level 502 is present in each of the regions 512, 514, and 516. Biasing of the front gate relative to the fin and biasing of the back gate relative to the fin results in "band bending" of energy bands 515, 504, 513 and 506 at barriers 508 and 510.

A distance 532 represents a back bias voltage needed to program the FinFET transistor without biasing the first gate. When the first gate is biased, a valence band energy shift 526 occurs from the valence band 504 (no first gate bias) to the valence band 515 (first gate bias applied), and a conduction band energy shift 522 occurs from the conduction band 506 (no first gate bias) to the conduction band 513 (first gate bias applied). A WRITE function is accomplished through accumulation of holes (i.e., positive charge carriers) in an interior region of the fin nearest the back gate. A region 528 is associated with hole trapping without biasing the first gate, and a region 530 is associated with hole trapping with first gate bias applied.

A distance 534 represents the back bias voltage needed to program the FinFET transistor when the first gate is biased. As a result of an energy band shift when the first gate is biased, programming can occur at a lower back gate bias than when the first gate is not biased. In a particular embodiment, programming at a lower back gate bias voltage results in a longer refresh cycle time, and consequently lower power consumption.

Figure 6:
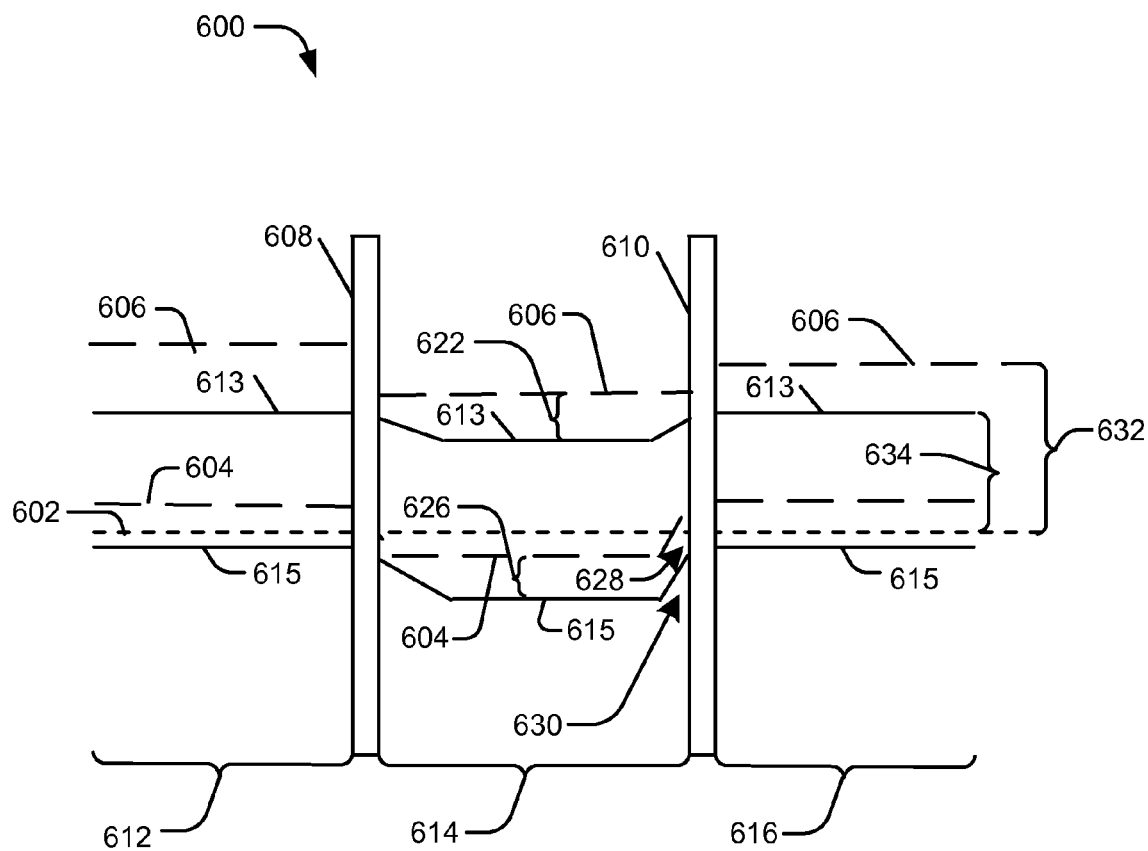
FIG. 6 is an energy band diagram of a FinFET transistor that illustrates biasing the first gate during a HOLD phase, according to a particular embodiment.

FIG. 6 is an energy band diagram associated with a FinFET transistor that illustrates biasing a first gate during a HOLD phase, according to a particular embodiment. In an illustrative embodiment, the FinFET transistor may be the FinFET transistor 100 of FIG. 1. The band diagram is generally designated 600. In a particular illustrative embodiment the transistor includes a first gate situated beneath a BOX layer within a substrate, a second gate (front gate) situated adjacent the fin, and a third gate (back gate) situated adjacent the fin. A region 612 corresponds to the front gate. A region 614 corresponds to a fin of the FinFET transistor. A region 616 corresponds to the back gate of the FinFET transistor. A Fermi Level is indicated at 602. A valence band 604 and a conduction band 606 are shown, for which no first gate biasing has been applied. A shifted valence band 615 and a shifted conduction band 613 are shown, for which first gate biasing has been applied. The valence band 604 has been shifted by an amount 626 due to the first gate biasing, and the conduction band 606 has been shifted by an amount 622 due to the first gate biasing. Barriers 608 and 610 represent separations of the fin from the front gate and back gate, respectfully. In an illustrative embodiment, the barriers 608 and 610 are associated with corresponding oxide layers.

During a HOLD phase of the FinFET transistor in which a bit value may be stored, a current flows along a longitudinal direction of the fin due to longitudinal biasing of the fin. The current can be affected through biasing each of the gates. In a particular embodiment, each of the gates may be biased at an independently selected bias voltage. Holding of a data bit in the FinFET transistor is established through steady-state excess hole concentration trapped in a region of the fin near an insulating barrier that separates the fin from a gate. An excess concentration of holes in the fin region 614 of the energy band diagram 600 is trapped within a region 628 when the first gate is unbiased, and the excess hole concentration is trapped within a region 630 when the first gate is biased. Prior to biasing the first gate, the back gate bias needed to establish the HOLD state is shown as 632, and with first gate bias applied the back gate bias needed to establish the HOLD state is shown as 634. A smaller back gate bias voltage may be required to maintain the HOLD state within the FinFET transistor having a first gate bias applied.

Figure 7:
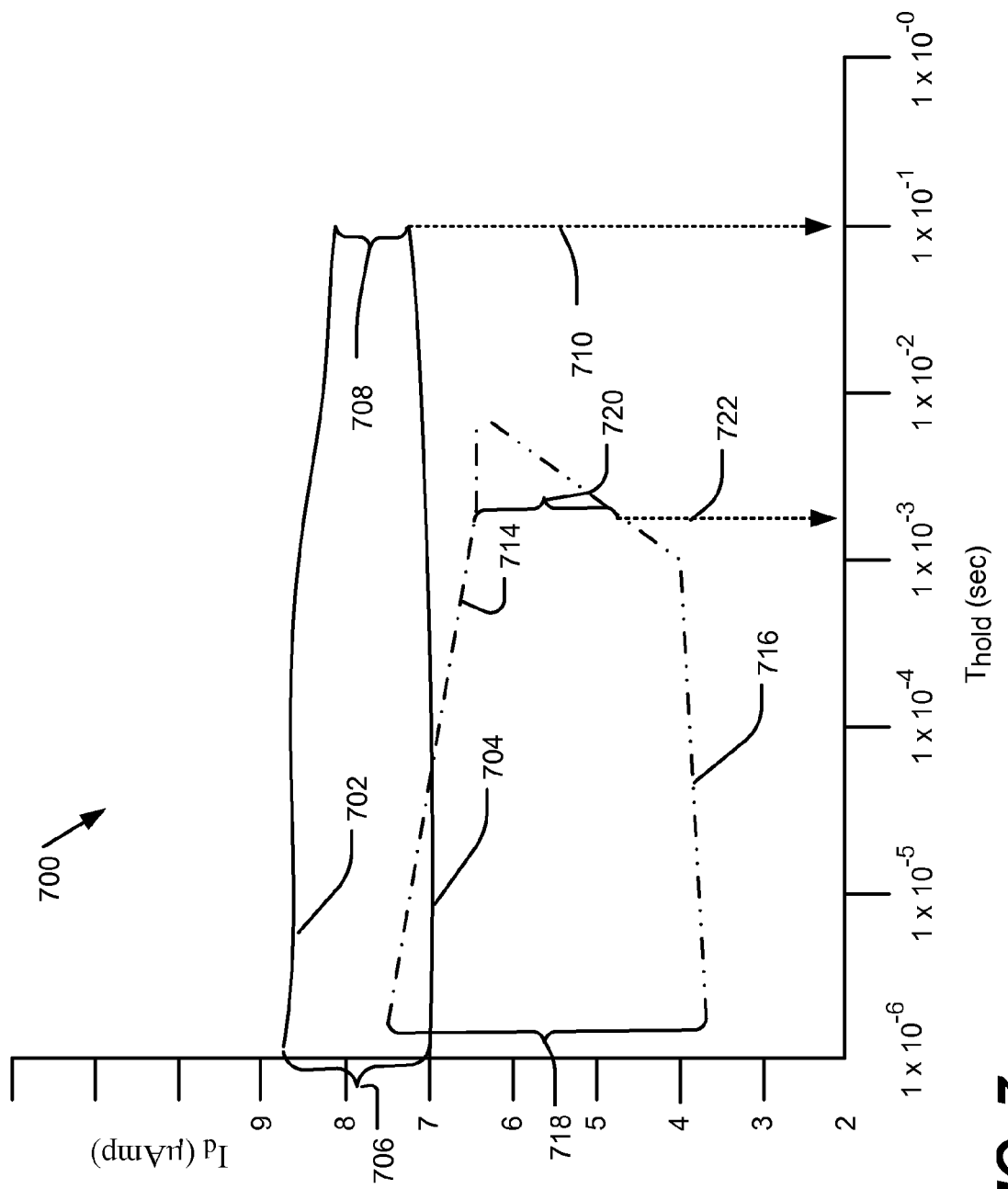
FIG. 7 is a graph of source-drain current v. time at different back gate bias voltages, according to a particular illustrative embodiment.

FIG. 7 is a graph of source-drain current over time of a FinFET transistor, according to a particular illustrative embodiment. The graph 700 illustrates a particular advantage in reducing gate bias voltage when using a FinFET transistor as a memory storage bit cell.

The FinFET transistor has been programmed to store a data bit in HOLD phase. Curve 702 represents source-drain current over time of a FinFET transistor having stored a "1" data bit and maintaining a back gate voltage of approximately minus 1.0 volt. Curve 704 represents source-drain current over time of the FinFET transistor having a stored "0" data bit with a back gate bias voltage of approximately minus 1.0 V. A current difference 706 is a difference in source-drain current values between a stored "1" bit and a stored "0" bit after $1 \times 10^{-6}$ seconds. In general, the greater the difference in current values between 702 and 704, the easier it is to determine a value of the stored bit.

Over the course of time the difference in source-drain current value between a "1" bit and a "0" bit tends to diminish, due to factors such as electron-hole recombination. For example, at pointer 710 the elapsed time is approximately $1 \times 10^{-1}$ seconds, and a current difference 708 between a "1" and a "0" has a value that is approximately one-half of the current difference 706. The difference in corresponding elapsed times between quantities 708 and 702 is referred to as a half-lifetime between the "1" state and the "0" state. At a back gate voltage of minus 1.0 V, the half-lifetime is approximately $(1 \times 10^{-1} - 1 \times 10^{-6}) \approx 1 \times 10^{-1}$ seconds.

In contrast, curves 714 and 716 depict source-drain current over time for a back gate bias of approximately minus 2.0 V. Curve 714 represents source-drain current for a stored "1" bit, and curve 716 represents source-drain current for a stored "0" bit. A difference between source-drain currents of a "1" stored bit and a "0" stored bit at approximately $1 \times 10^{-6}$ seconds is indicated at 718. A half-lifetime value is indicated at 720 and the corresponding elapsed time is indicated by pointer 722, which is approximately $2 \times 10^{-3}$ seconds. At a back gate voltage of minus 2.0 V, the half-lifetime is approximately $(2 \times 10^{-3} - 1 \times 10^{-6}) \approx 2 \times 10^{-3}$ seconds.

Comparing the half-lifetime 710 at a back bias of 1.0 V and the half-lifetime 722 at a back bias of minus 2.0 V, it can be seen that the half lifetime of the FinFET transistor operating at a back gate bias of minus 1.0 V is approximately 50 times the half-lifetime of a FinFET transistor operating at a back gate bias of minus 2.0 V. Operating the back gate at a lower bias voltage results longer time intervals between memory refresh, and consequently lower power consumption. A FinFET having three or more gates, such as the FinFET transistor of FIG. 1, FIG. 2, or FIG. 3, can operate at a lower back gate bias than a single gate FinFET transistor or a dual gate FinFET transistor with correspondingly larger half-lifetimes and longer times between memory refresh, and consequently lower power consumption.

Figure 8:
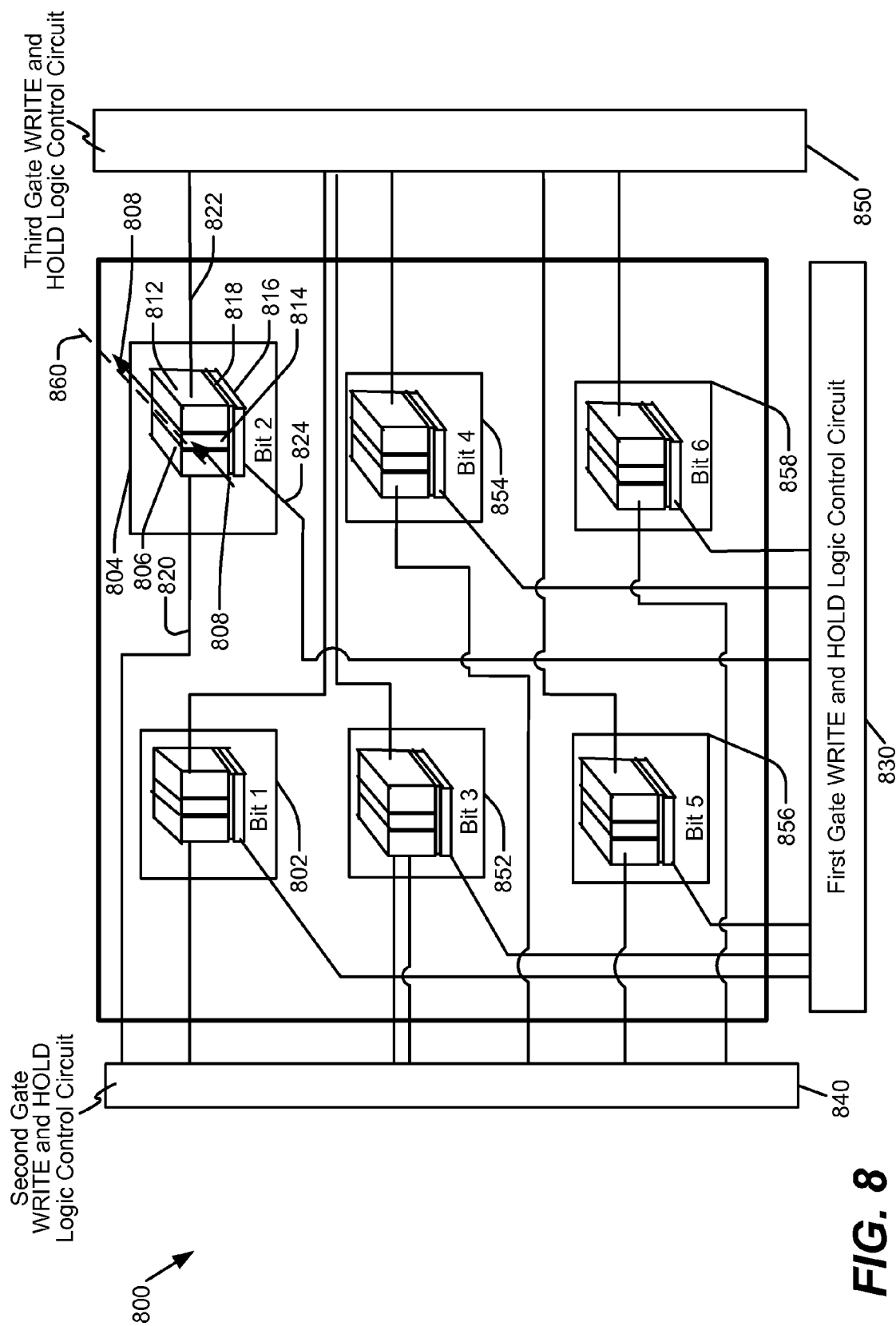
FIG. 8 is a diagram of a particular illustrative embodiment of a memory utilizing FinFETs.

FIG. 8 is a diagram of a particular illustrative embodiment of a memory utilizing FinFETs, generally designated 800. The memory 800 can include a plurality of FinFET transistors, with each FinFET transistor configured to store a single data bit. Each FinFET transistor 802, 804, 852, 854, 856 and 858 is configured to store one bit of data. Each of the FinFET transistors shown may be constructed according to FIG. 1, FIG. 2, or FIG. 3. The memory includes a first gate WRITE and HOLD logic control circuit 830 to control a corresponding first gate of each of the FinFET transistors 802, 804, 852, 854, 856 and 858. The memory also includes a second gate WRITE and HOLD logic control circuit 840 to control a corresponding second gate of each of the FinFET transistors 802, 804, 852, 854, 856 and 858. The memory also includes a third gate WRITE and HOLD logic control circuit 850 to control a corresponding third gate of each of the FinFET transistors 802, 804, 852, 854, 856 and 858. For simplicity of presentation, each of the FinFET transistors 802, 804, 852, 854, 856 and 858 is constructed as in FIG. 1.

During operation, using the FinFET transistor 804 as a representative example, a source-drain bias can be applied in a direction essentially parallel to a longitudinal axis 860 of a source-drain channel (fin) 814. A first gate 816 is situated beneath a Buried Oxide (BOX) layer 818, and the BOX layer 818 is situated adjacent to a first face of fin 814. A second gate 806 is adjacent to the fin 814 at a second face, and a third gate 812 is situated adjacent to the fin 814 at a third face. A first bias line 824 is configured to bias the first gate 816. A second bias line 820 is configured to bias the second gate 806, and a third bias line 822 is configured to bias the third gate 812. As a result of a longitudinal bias applied along the longitudinal axis 860 of the fin 814, a current 808 flows along the longitudinal axis of the fin 814 from a source to a drain. During a WRITE phase of the FinFET transistor 804, bias voltages are selected and applied to each of the lines 824, 820, and 822 resulting in a particular value of current 808 within the fin and a buildup of holes in the interior region of the fin. During a HOLD state of the FinFET transistor 804, the voltages applied by lines 824, and 820, and 822 are set at corresponding HOLD values. In an ERASE mode of the FinFET transistor 804, electrons may be injected into the interior of the fin 814, neutralizing the excess hole concentration.

The first bias line 824 can be controlled by a first gate WRITE and HOLD logic control circuit 830. The second bias line 820 can be controlled by a second gate WRITE and HOLD logic control circuit 840. The third bias line 822 can be controlled by a third gate WRITE and HOLD logic control circuit 850. In similar fashion, each of the other FinFET transistors that stores a single bit of data can be controlled by corresponding bias lines, and each bias line is in turn biased by a corresponding control circuit. For example, each of the corresponding second gates of the FinFETs are controlled by the second gate WRITE and HOLD logic control circuit 840, each of the first gate biases are controlled by the first gate WRITE and HOLD logic control circuit 830, and each of the corresponding third gates of the FinFETs are controlled by the third gate WRITE and HOLD logic control circuit 850. As illustrated in FIGS. 4-6, lower bias voltages may be employed during WRITE and HOLD phases to provide benefits as explained with reference to FIG. 7.

Figure 9:
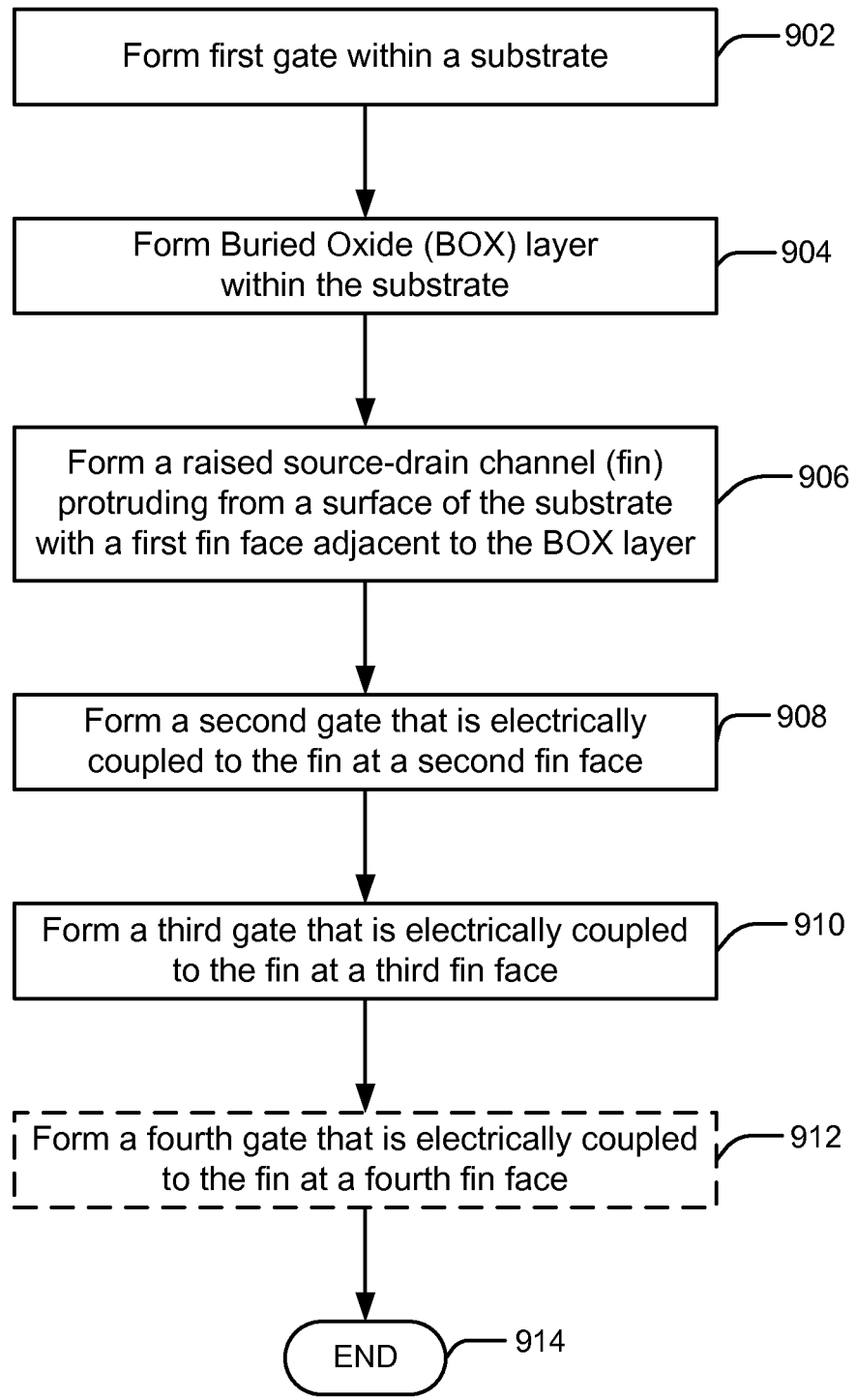
FIG. 9 is a flow diagram of a particular illustrative embodiment of a method of fabricating a transistor.

FIG. 9 is a flow diagram of a particular illustrative embodiment of a method of fabricating a transistor. At block 902, a gate of the transistor is formed within a substrate having a surface. Moving to block 904, a Buried Oxide (BOX) layer is formed within the substrate adjacent to the gate at a first BOX layer face. Proceeding to block 906, a raised source-drain channel (fin) is formed where at least a portion of the fin extends from the surface of the substrate, with a first fin face adjacent a second BOX layer face of the BOX layer. The gate (bottom gate) is electrically coupled to the fin through the BOX layer, and the gate is operable to be electrically coupled to a first bias source. Advancing to block 908, a second gate (front gate) is formed that is electrically coupled to the fin at a second fin face. Moving to block 910, a third gate (back gate) is formed that is electrically coupled to the fin at a third fin face. The front gate is operable to be electrically coupled to a second bias source, and the back gate is operable to be electrically coupled to a third bias source. Advancing to block 912, optionally, a fourth gate is formed that is electrically coupled to the fin at a fourth fin face. The method terminates at block 914.

Figure 10:
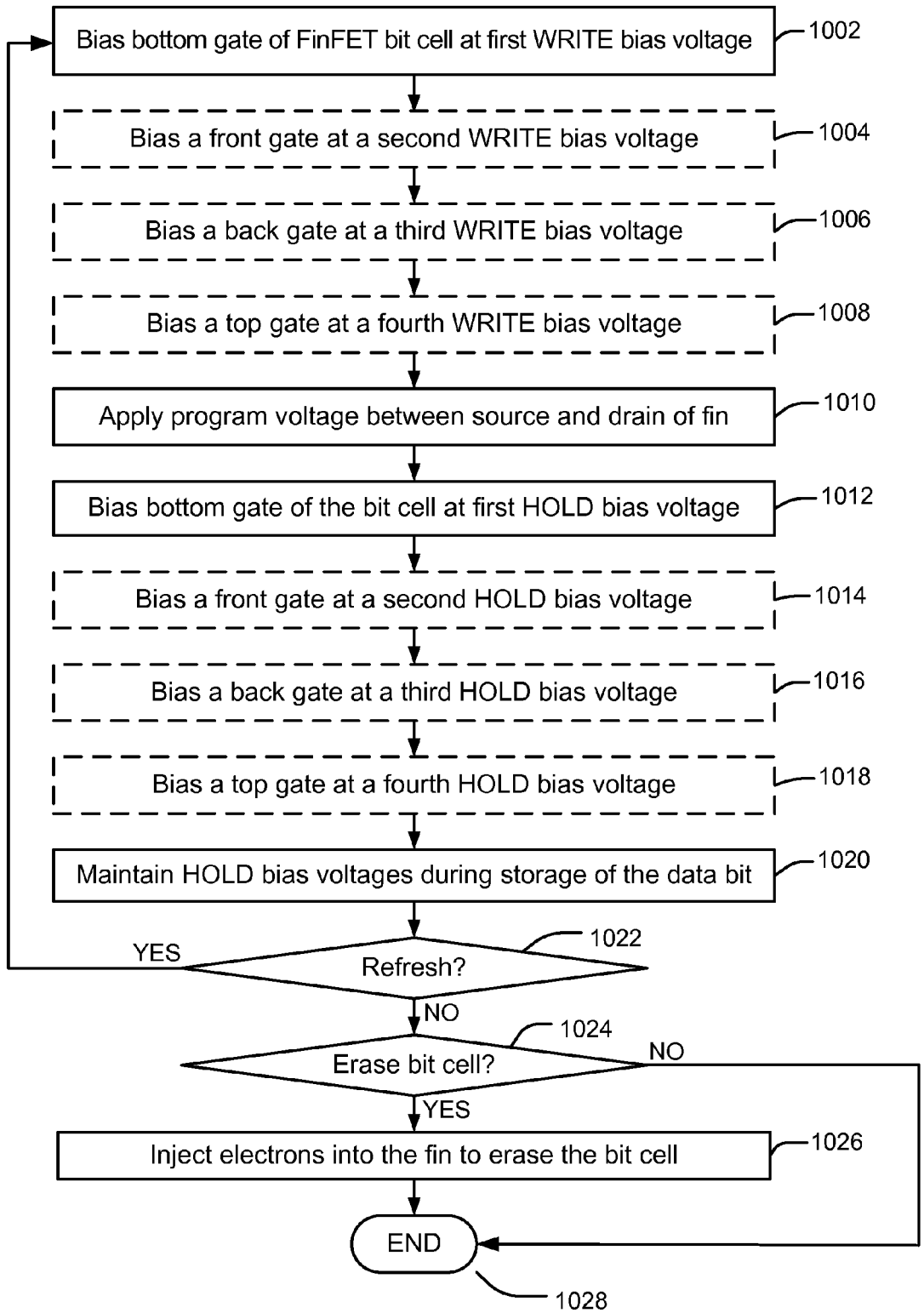
FIG. 10 is a flow diagram of a particular illustrative embodiment of a method of programming a bit cell.

FIG. 10 is a flow diagram of a particular illustrative embodiment of a method of programming a FinFET transistor bit cell (also called "bit cell" herein). At block 1002 a bottom gate (also called "first gate" herein) of a FinFET transistor bit cell is biased at a first WRITE bias voltage, where the bottom gate is electrically coupled to a source-drain channel ("fin") of the bit cell, the fin having a source end and a drain end and the fin protruding from a substrate, and where the bottom gate is separated from the fin by a buried oxide (BOX) layer situated within the substrate. Moving to block 1004, optionally a front gate (also "second gate" herein) is biased at a second WRITE bias voltage, the front gate electrically coupled to the fin at a second fin face. Advancing to block 1006, a back gate (also "third gate" herein) is optionally biased at a third WRITE bias voltage, the back gate electrically coupled to the fin at a third fin face. Moving to block 1008, optionally a top gate (also called "fourth gate" herein) is biased at a fourth WRITE bias voltage. Advancing to 1010, a program voltage is applied longitudinally between the source end and the drain end of the fin, causing a source-drain current to flow.

Moving to block 1012, the bottom gate of the bit cell is biased at a first HOLD bias voltage. In a particular illustrative embodiment, the first HOLD bias voltage differs from the first WRITE bias voltage. Moving to block 1014, optionally the front gate may be biased at a second HOLD bias voltage. In a particular illustrative embodiment, the second HOLD bias voltage differs from the second WRITE bias voltage. Moving to block 1016, the back gate may be biased at a third HOLD bias voltage. In a particular illustrative embodiment, the third HOLD bias voltage differs from the third WRITE bias voltage. Proceeding to block 1018, the top gate may be biased at a fourth HOLD bias voltage. In a particular illustrative embodiment, the fourth HOLD bias voltage differs from the fourth WRITE bias voltage. Moving to block 1020, the bias voltages are maintained at HOLD bias values during storage of the data bit.

Proceeding to decision block 1022, a decision is made as to whether to refresh the stored bit. If the stored bit is to be refreshed, returning to block 1002, the bottom gate of the bit cell is biased at the first WRITE bias voltage, and the method proceeds to block 1004. If, at decision block 1022, the stored bit is not to be refreshed, proceeding to decision block 1024, a decision is made as to whether to erase the bit cell. If the bit cell is not to be erased, the method terminates at block 1028. If, the bit cell is to be erased, proceeding to block 1026, electrons are injected into the fin to erase the bit cell. The method terminates at block 1028.

A FinFET transistor having three independently electrically biasable gates enables the FinFET transistor to store a data bit with lower bias voltages than in a FinFET transistor with only two gates. Holding data at lower bias voltages can result in longer times between memory refresh as illustrated in FIG. 7, and consequently lower power consumption. In particular, a FinFET transistor may be constructed with a first gate that couples electrically to the fin and is situated beneath a Buried Oxide (BOX) Layer. When the gate beneath the Buried Oxide (BOX) layer is selectively biased, the HOLD phase may be invoked at lower bias voltages of a second gate and a third gate than corresponding bias voltages in a FinFET transistor having only two gates.

Figure 11:
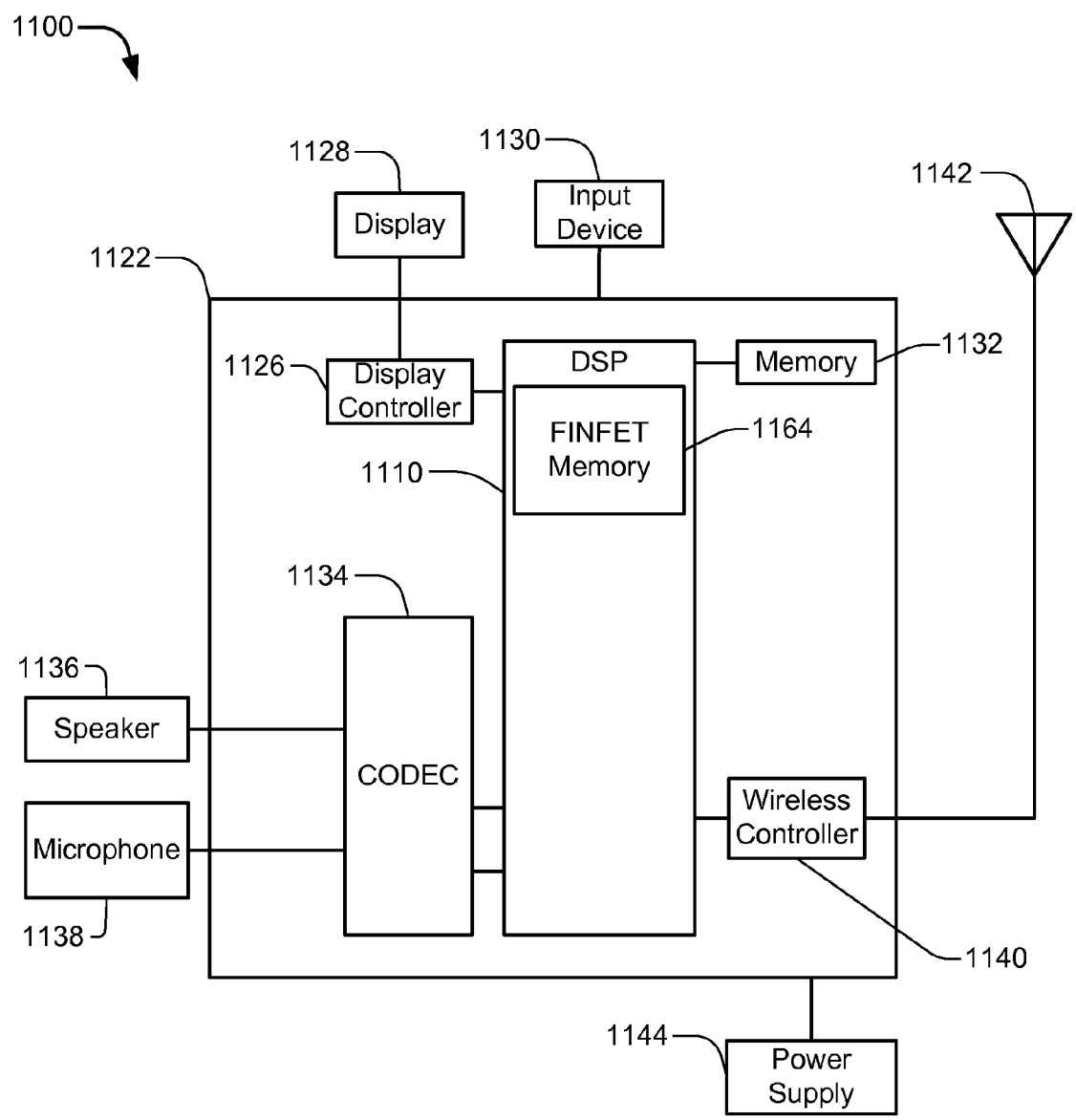
FIG. 11 is a block diagram of a particular illustrative embodiment of an electronic device utilizing a FinFET.

Referring to FIG. 11, a block diagram of a particular illustrative embodiment of an electronic device utilizing a FinFET transistor is depicted and generally designated 1100. The device 1100 includes a processor, such as a digital signal processor (DSP) 1110, coupled to a memory 1132. The device 1100 also includes a FinFET memory 1164. In an illustrative example, the FinFET memory 1164 includes the FinFET transistor depicted in one or more of the systems of FIGS. 1-3 and 8, the FinFET transistor may operate in accordance with one or more of FIGS. 4-7 and 10, and may be formed according to FIG. 9, or any combination thereof. Although the FinFET memory 1164 is depicted as part of a Digital Signal Processor (DSP) 1110, in other embodiments the FinFET memory 1164 may be separate from the DSP 1110.

FIG. 11 also shows a display controller 1126 that is coupled to the digital signal processor 1110 and to a display 1128. A coder/decoder (CODEC) 1134 can also be coupled to the digital signal processor 1110. A speaker 1136 and a microphone 1138 can be coupled to the CODEC 1134.

FIG. 11 also indicates that a wireless controller 1140 can be coupled to the digital signal processor 1110 and to a wireless antenna 1142. In a particular embodiment, the FinFET memory 1164, the DSP 1110, the display controller 1126, the memory 1132, the CODEC 1134, and the wireless controller 1140 are included in a system-in-package or system-on-chip device 1122. In a particular embodiment, an input device 1130 and a power supply 1144 are coupled to the system-on-chip device 1122. Moreover, in a particular embodiment, as illustrated in FIG. 11, the display 1128, the input device 1130, the speaker 1136, the microphone 1138, the wireless antenna 1142, and the power supply 1144 are external to the system-on-chip device 1122. However, each of the display 1128, the input device 1130, the speaker 1136, the microphone 1138, the wireless antenna 1142, and the power supply 1144 can be coupled to a component of the system-on-chip device 1122, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a plurality of bit cell memory transistors, wherein each bit cell memory transistor of the plurality of bit cell memory transistors is configured to store a single data bit,
wherein each bit cell memory transistor is configured to operate in a hold phase and in a write phase, and wherein each bit cell memory transistor comprises:
a fin defining a source-drain channel protruding from a surface of a substrate;
a first gate configured to be electrically coupled to a first bias source to receive a first gate voltage, wherein the first gate is adjacent to the fin at a first fin face, and separated from the fin by a buried oxide (BOX) layer;
a second gate configured to be electrically coupled to a second bias source to receive a second gate voltage, wherein the second gate is situated adjacent to the fin at a second fin face; and
a third gate configured to be electrically coupled to a third bias source to receive a third gate voltage, wherein the third gate is situated adjacent to the fin at a third fin face;
a first gate write and hold logic control circuit configured to control the first gate of each bit cell memory transistor;
a second gate write and hold logic control circuit configured to control the second gate of each bit cell memory transistor; and
a third gate write and hold logic control circuit configured to control the third gate of each bit cell memory transistor,
wherein, when a particular bit cell memory transistor operates in the hold phase, the first gate write and hold logic control circuit, the second gate write and hold logic control circuit, and the third gate write and hold logic control circuit are configured to apply low values of the first gate voltage, the second gate voltage, and the third gate voltage to the particular bit cell memory transistor.

2. The apparatus of claim 1, wherein the fin is configured to be electrically coupled to a fourth bias source along a longitudinal axis of the fin to receive a current flowing along a direction parallel to the longitudinal axis.

3. The apparatus of claim 1, wherein a first combination of the first gate voltage, the second gate voltage, and the third gate voltage is configured to establish a first current flowing in the fin which maintains a "1" data bit when the particular bit cell memory transistor operates in the hold phase, and wherein a second combination of the first gate voltage, the second gate voltage, and the third gate voltage is configured to establish a second current flowing in the fin which maintains a "0" data bit when the particular bit cell memory transistor operates in the hold phase.

4. The apparatus of claim 3, wherein a refresh cycle during the hold phase is a time difference between a second time and a first time, wherein a first current difference is a difference between the first current and the second current at the first time, and wherein a second current difference is a difference between the first current and the second current at the second time, and wherein the second current difference is half of the first current difference.

5. The apparatus of claim 1, wherein the first gate write and hold logic control circuit is coupled to the first gate of each bit cell memory transistor via a corresponding first bias line of a plurality of first bias lines.

6. The apparatus of claim 1, wherein the second gate write and hold logic control circuit is coupled to the second gate of each bit cell memory transistor via a corresponding second bias line of a plurality of second bias lines.

7. The apparatus of claim 1, wherein the third gate write and hold logic control circuit is coupled to the third gate of each bit cell memory transistor via a corresponding third bias line of a plurality of third bias lines.

8. The apparatus of claim 1, wherein, when the particular bit cell memory transistor operates in the write phase, the first gate write and hold logic control circuit, the second gate write and hold logic control circuit, and the third gate write and hold logic control circuit are configured to apply values of the first gate voltage, the second gate voltage, and the third gate voltage to accumulate a plurality of holes in the fin of the particular bit cell memory transistor.

* * * * *